(12) United States Patent
Trubelja et al.

(10) Patent No.: US 9,506,140 B2
(45) Date of Patent: Nov. 29, 2016

(54) SPALLATION-RESISTANT THERMAL BARRIER COATING

(71) Applicant: United Technologies Corporation, Hartford, CT (US)

(72) Inventors: Mladen F. Trubelja, Manchester, CT (US); Dinesh K. Gupta, South Windsor, CT (US); Brian S. Tryon, Los Gatos, CA (US); Mark T. Ucasz, Middletown, CT (US); Benjamin J. Zimmerman, Moseley, VA (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 14/209,761

(22) Filed: Mar. 13, 2014

(65) Prior Publication Data

US 2014/0272456 A1    Sep. 18, 2014

Related U.S. Application Data

(60) Provisional application No. 61/800,594, filed on Mar. 15, 2013.

(51) Int. Cl.
| | |
|---|---|
| *C23C 14/24* | (2006.01) |
| *C23C 14/08* | (2006.01) |
| *F01D 5/28* | (2006.01) |
| *C23C 14/16* | (2006.01) |
| *C23C 14/32* | (2006.01) |

(52) U.S. Cl.
CPC .............. *C23C 14/08* (2013.01); *C23C 14/16* (2013.01); *C23C 14/24* (2013.01); *C23C 14/325* (2013.01); *F01D 5/288* (2013.01); *F05D 2300/13* (2013.01); *F05D 2300/175* (2013.01); *F05D 2300/2118* (2013.01); *Y10T 428/12618* (2015.01)

(58) Field of Classification Search
CPC ............ C23C 14/325; H01J 37/32055; H01J 37/32064
See application file for complete search history.

(56) References Cited

U.S. PATENT DOCUMENTS

| | | | | |
|---|---|---|---|---|
| 4,109,061 | A | * | 8/1978 | Beale et al. ................... 428/678 |
| 4,944,858 | A | * | 7/1990 | Murphy ................ C23C 14/165 |
| | | | | 204/192.15 |
| 5,972,185 | A |  | 10/1999 | Hendricks et al. |
| 6,176,982 | B1 |  | 1/2001 | Rickerby |
| 6,226,978 | B1 |  | 5/2001 | Chandra et al. |
| 6,270,318 | B1 |  | 8/2001 | Shah et al. |

(Continued)

FOREIGN PATENT DOCUMENTS

| | | |
|---|---|---|
| EP | 1700932 A1 | 9/2006 |
| EP | 1801263 A1 | 6/2007 |

(Continued)

OTHER PUBLICATIONS

International Search Report and Written Opinion for PCT/US2014/026452, dated Jul. 7, 2014.

(Continued)

*Primary Examiner* — Jason M Berman
(74) *Attorney, Agent, or Firm* — Bachman & LaPointe, P.C.

(57) ABSTRACT

A coated article has: a metallic substrate (22); a bondcoat (30); and a thermal barrier coating (TBC) (28). The bondcoat has a first layer (32) and a second layer (34), the first layer having a lower Cr content than the second layer.

16 Claims, 6 Drawing Sheets

(56) References Cited

U.S. PATENT DOCUMENTS

| | | |
|---|---|---|
| 6,416,882 B1 * | 7/2002 | Beele et al. ............... 428/633 |
| 6,435,826 B1 | 8/2002 | Allen et al. |
| 6,435,830 B1 | 8/2002 | Allen et al. |
| 6,435,835 B1 | 8/2002 | Allen et al. |
| 6,926,811 B2 | 8/2005 | Morstein et al. |
| 7,060,366 B2 | 6/2006 | Gupta et al. |
| 2007/0231589 A1 * | 10/2007 | Smeggil et al. ............ 428/469 |
| 2008/0138529 A1 * | 6/2008 | Weaver et al. ............. 427/456 |
| 2008/0166548 A1 | 7/2008 | Harada et al. |
| 2008/0261069 A1 | 10/2008 | Arikawa et al. |
| 2010/0254820 A1 | 10/2010 | Maly et al. |
| 2010/0266409 A1 | 10/2010 | Chandra et al. |
| 2011/0268987 A1 | 11/2011 | Schmitz et al. |
| 2012/0193217 A1 | 8/2012 | Tryon et al. |
| 2014/0011049 A1 | 1/2014 | Stamm |

FOREIGN PATENT DOCUMENTS

| | | |
|---|---|---|
| EP | 1990440 A1 | 11/2008 |
| EP | 2682488 A1 | 1/2014 |
| WO | 01/23643 A2 | 4/2001 |
| WO | 2009/038743 A1 | 3/2009 |
| WO | 2011103927 A1 | 9/2011 |

OTHER PUBLICATIONS

European Search Report for EP Patent Application No. 14767987.2, dated Sep. 27, 2016.

* cited by examiner

FIG. 6
Table I
Substrate Alloy Compositions (wt. %)

| Ni-Based Alloy | Casting Type | Range | Cr | Co | Mo | W | Ti | Ta | Al | B | C | Zr | Nb | Hf | Re | Mn | Si | Fe | Ni |
|---|---|---|---|---|---|---|---|---|---|---|---|---|---|---|---|---|---|---|---|
| DS GTD-111 | DS | Min | 13.70 | 9.00 | 1.25 | 3.50 | 4.70 | 2.60 | 2.800 | 0.008 | 0.080 | | | | | | | | R |
| | | Max | 14.30 | 10.00 | 1.75 | 4.10 | 5.10 | 3.00 | 3.200 | 0.018 | 0.120 | | | | | | | | R |
| IN-792 MOD | SX | Min | 11.60 | 8.50 | 1.65 | 3.50 | 3.90 | 4.80 | 3.400 | | 0.050 | | | | | | | | R |
| | | Max | 12.70 | 9.50 | 1.65 | 4.10 | 4.25 | 5.20 | 3.800 | | 0.090 | | | | | | | | R |
| MAR-M-247 | Conv | Min | 8.00 | 9.00 | 0.50 | 9.50 | 0.90 | 2.80 | 5.300 | 0.010 | 0.130 | 0.0300 | | 1.20 | | | | | R |
| | | Max | 8.80 | 11.00 | 0.80 | 10.50 | 1.20 | 3.30 | 5.700 | 0.020 | 0.170 | 0.0800 | | 1.60 | | | | | R |
| Alloy 454 | SX | Min | 9.50 | 4.50 | | 3.75 | 1.25 | 11.75 | 4.750 | | | | | | | | | | R |
| | | Max | 10.50 | 5.50 | | 4.25 | 1.75 | 12.25 | 5.250 | | | | | | | | | | R |
| SC 2000 | SX | Min | 4.75 | 9.50 | 1.70 | 5.60 | | 8.40 | 5.500 | | | | | 0.05 | 2.80 | | | | R |
| | | Max | 5.25 | 10.50 | 2.10 | 6.20 | | 9.00 | 5.800 | | | | | 0.15 | 3.20 | | | | R |
| General Alloy | | Min | 4.50 | 4.50 | 0.00 | 1.50 | 0.00 | 0.00 | 1.000 | 0.000 | 0.000 | 0.0000 | 0.00 | 0.00 | 0.00 | | | | R |
| | | Max | 24.00 | 20.00 | 4.50 | 11.00 | 5.50 | 12.25 | 6.200 | 0.050 | 0.200 | 0.2000 | 1.20 | 2.00 | 3.50 | | | | R |

| Co-Based Alloy | Casting Type | Range | Cr | Co | Mo | W | Ti | Ta | Al | B | C | Zr | Nb | Hf | Re | Mn | Si | Fe | Ni |
|---|---|---|---|---|---|---|---|---|---|---|---|---|---|---|---|---|---|---|---|
| MAR-M-509 | Conv | Min | 22.50 | R | | 6.50 | 0.15 | 3.00 | | | 0.550 | 0.3000 | | | | | | | 9.0 |
| | | Max | 24.25 | R | | 7.50 | 0.30 | 4.00 | | | 0.650 | 0.6000 | | | | | | | 11.0 |
| FSX-414 | Conv | Min | 28.50 | R | | 6.50 | | | | 0.005 | 0.200 | | | | | 0.40 | 0.50 | | 9.5 |
| | | Max | 30.50 | R | | 7.50 | | | | 0.015 | 0.300 | | | | | 1.00 | 1.00 | | 11.5 |
| General Alloy | | Min | 18.00 | R | 0.00 | 0.00 | 0.00 | 1.00 | 0.000 | 0.000 | 0.100 | 0.2000 | 0.00 | | | | | 0.00 | 0.0 |
| | | Max | 31.00 | R | 10.00 | 12.00 | 3.00 | 10.00 | 0.500 | 0.020 | 0.900 | 0.6000 | 2.00 | | | | | 2.00 | 15.0 |

FIG. 7
Table II
High-Al Bondcoat Compositions (wt. %)

| Range | | Cr | Co | Al | Y | Si | Hf | Ta | W | Mo | Zr | Ni |
|---|---|---|---|---|---|---|---|---|---|---|---|---|
| Broad | Min | 5 | 0 | 6 | 0.1 | 0.1 | 0.1 | 0.0 | 0.0 | 0.0 | 0.0 | Bal. |
| | Max | 30 | 30 | 35 | 2 | 7.0 | 2.0 | 8.0 | 8.0 | 2.0 | 2.0 | Bal. |
| Intermediate | Min | 10 | 15 | 10 | 0.2 | 0.2 | 0.1 | 0.0 | 0.0 | 0.0 | 0.0 | Bal. |
| | Max | 20 | 25 | 15 | 1.0 | 1.0 | 0.5 | 6.0 | 5.0 | 1.7 | 0.2 | Bal. |
| Example | Min | 14 | 20 | 11.0 | 0.4 | 0.3 | 0.1 | 0.0 | 0.0 | 0.0 | 0.0 | Bal. |
| | Max | 18 | 24 | 13.5 | 0.8 | 0.7 | 0.4 | 0.1 | 0.1 | 0.1 | 0.1 | Bal. |

FIG. 8
Table III
High-Cr Bondcoat Compositions (wt. %)

| Range | | Cr | Co | Al | Y | Si | Hf | Ta | W | Mo | Zr | Ni |
|---|---|---|---|---|---|---|---|---|---|---|---|---|
| Broad | Min | 20 | 0 | 5 | 0 | 0 | 0 | | | | | Bal. |
| | Max | 40 | 30 | 13 | 2 | 2 | 2 | | | | | Bal. |
| Intermediate | Min | 25 | 10 | 6 | 0.2 | 0.1 | 0.1 | | | | | Bal. |
| | Max | 35 | 20 | 10 | 1.0 | 1.0 | 1.0 | | | | | Bal. |
| Example | Min | 29.5 | 15 | 6.5 | 0.25 | 0.15 | 0.1 | | | | | Bal. |
| | Max | 34.5 | 19 | 9.2 | 0.75 | 0.65 | 0.4 | | | | | Bal. |

SPALLATION-RESISTANT THERMAL BARRIER COATING

CROSS-REFERENCE TO RELATED APPLICATION

Benefit is claimed of U.S. Patent Application Ser. No. 61/800,594, filed Mar. 15, 2013, and entitled "Spallation-Resistant Thermal Barrier Coating", the disclosure of which is incorporated by reference herein in its entirety as if set forth at length.

BACKGROUND

The disclosure relates to gas turbine engines. More particularly, the disclosure relates to hot-corrosion resistant bondcoats for thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes NiCoCrAlY bondcoat as the first layer (e.g., low pressure plasma sprayed (LPPS)) and yttria-stabilized zirconia (YSZ) (or gadolinia-stabilized zirconia (GSZ)) thermal barrier coating (TBC) (e.g., air plasma sprayed (APS), suspension plasma sprayed (SPS) or electron beam physical vapor deposited (EBPVD)) as the second layer. Prior to and while the thermal barrier coat layer is being deposited, a thermally grown oxide (TGO) layer (e.g., alumina) forms atop the bondcoat layer. As time-at-temperature and the number of cycles increase during subsequent service exposure, this TGO interface layer grows in thickness. An exemplary YSZ is 7 weight percent yttria-stabilized zirconia (7YSZ).

Exemplary TBCs are applied to thicknesses of 1-40 mils (0.025-1.0 mm) and can contribute to a temperature reduction of up to 300° F. (167° C.) at the base metal. This temperature reduction translates into improved part durability, or higher turbine operating temperatures and improved turbine efficiency.

SUMMARY

One aspect of the disclosure involves a coated article having: a metallic substrate; a bondcoat; and a thermal barrier coating (TBC). The bondcoat has a first layer and a second layer, the first layer having a lower Cr content than the second layer.

In additional or alternative embodiments of any of the foregoing embodiments single or multilayer TBC comprises material selected from the group consisting of yttria-stabilized zirconia or gadolinia-stabilized zirconia or combinations thereof.

In additional or alternative embodiments of any of the foregoing embodiments, the article consists essentially of the substrate, the bondcoat first layer, the bondcoat second layer, thermally grown oxide (TGO) and the TBC.

In additional or alternative embodiments of any of the foregoing embodiments, by weight percent: the bondcoat second layer comprises 20-40 Cr, up to 30 Co, 5-13 Al, up to 2Y, up to 2 Si, and up to 2 Hf; and the bondcoat first layer comprises 5-30 Cr, up to 30 Co, 6-35 Al, 0.1-2 Y, 0.1 to 2 Hf, and 0.1 to 7 Si, up to 8 Ta, up to 8 W, up to 2 Mo, and up to 2 Zr.

In additional or alternative embodiments of any of the foregoing embodiments: the bondcoat second layer has a chromium content at least 10 weight percent higher than a chromium content of the bondcoat first layer; and the bondcoat first layer has an aluminum content at least 2 weight percent higher than an aluminum content of the bondcoat second layer.

In additional or alternative embodiments of any of the foregoing embodiments, the substrate comprises a nickel or a cobalt based superalloy.

In additional or alternative embodiments of any of the foregoing embodiments, the nickel based superalloy comprises, in weight %, 4.5-24 Cr, 4.5-20 Co, up to 4.5 Mo, 1.5-11 W, up to 5.5 Ti, up to 12.25 Ta, 1-6.2 Al, up to 0.05 B, up to 0.2 C, up to 0.2 Zr, up to 1.2 Nb, up to 2.0 Hf, and up to 3.5 Re.

In additional or alternative embodiments of any of the foregoing embodiments, the cobalt based superalloy comprises, in weight %, 18-31 Cr, up to 15 Ni, up to 10 Mo, up to 12 W, up to 3 Ti, 1-10 Ta, up to 0.5 Al, up to 0.02 B, 0.1 to 0.9 C, 0.2 to 0.6 Zr, up to 2 Nb, and up to 2 Fe.

In additional or alternative embodiments of any of the foregoing embodiments, the article consists essentially of the substrate, the bondcoat first layer, the bondcoat second layer, and the TBC.

In additional or alternative embodiments of any of the foregoing embodiments, a method for manufacturing the article comprises: applying the bondcoat first layer having an as-applied weight % composition comprising 5-30 Cr, up to 30 Co, 6-35 Al, 0.1-2 Y, 0.1 to 2 Hf, and 0.1 to 7 Si, up to 8 Ta, up to 8 W, up to 2 Mo, and up to 2 Zr; and applying the bondcoat second layer atop the bondcoat first layer and having an as-applied weight % composition comprising 20-40 Cr, up to 30 Co, 5-13 Al, up to 2 Y, up to 2 Si, and up to 2 Hf.

In additional or alternative embodiments of any of the foregoing embodiments, the bondcoat first layer and the bondcoat second layer are applied by cathodic arc deposition. However, they could be applied by one or a combination of methods such as LPPS, HVOF, sputtering, EB-PVD or others known in industry.

In additional or alternative embodiments of any of the foregoing embodiments the bondcoat second layer is applied directly atop the bondcoat first layer; and the TBC is applied directly atop the bondcoat second layer.

In additional or alternative embodiments of any of the foregoing embodiments: a characteristic thickness of the bondcoat first layer is 1 to 10 mils (0.02 mm to 0.25 mm); and a characteristic thickness of the bondcoat second layer is 1 to 10 mils (0.02 mm to 0.25 mm).

In additional or alternative embodiments of any of the foregoing embodiments, the TBC comprises yttria-stabilized zirconia or gadolinia-stabilized zirconia or combinations of the two.

In additional or alternative embodiments of any of the foregoing embodiments, the substrate comprises a nickel based or a cobalt based superalloy.

Another aspect of the disclosure involves a method for cathodic arc deposition from a first cathode and a second cathode. The method comprises: placing one or more substrate(s) in a chamber; generating an arc between the first cathode and an anode to deposit a first material from the first cathode; and generating an arc between the second cathode and the anode to deposit a second material from the second cathode. A relative position of a magnet and the first and second cathodes is shifted to shift from depositing the first material to depositing the second material.

In additional or alternative embodiments of any of the foregoing embodiments, the shifting comprises vertically moving the magnet from a first position to a second position.

In additional or alternative embodiments of any of the foregoing embodiments, the method further comprises: vertically moving substrates from a first position associated with deposition from the first cathode to a second position associated with deposition from the second cathode.

In additional or alternative embodiments of any of the foregoing embodiments, the anode is a wall of the vacuum coating-chamber.

In additional or alternative embodiments of any of the foregoing embodiments: the substrate comprises a nickel-based or a cobalt-based superalloy; the first material is a first MCrAlY; and the second material is a second MCrAlY different from the first MCrAlY.

Another aspect of the disclosure involves an apparatus for cathodic arc deposition. The apparatus comprises: a chamber; a first cathode; a second cathode; a magnet; and an actuator for shifting a relative position of the magnet and the first and second cathodes shift from depositing from the first cathode to depositing from the second cathode.

In additional or alternative embodiments of any of the foregoing embodiments, the shifting comprises vertically moving the magnet from a first position to a second position.

In additional or alternative embodiments of any of the foregoing embodiments, the apparatus further comprises an actuator for vertically moving substrates from a first position associated with deposition from the first cathode to a second position associated with deposition from the second cathode.

In additional or alternative embodiments of any of the foregoing embodiments, the anode is a wall of the chamber and the first cathode and second cathode surround a vertical axis one above the other.

In additional or alternative embodiments of any of the foregoing embodiments: the first cathode comprises a first MCrAlY; and the second cathode comprises a second MCrAlY different from the first MCrAlY.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 6 is a table of alloy compositions.

FIG. 7 is a table of high-Al bondcoat compositions.

FIG. 8 is a table of high-Cr bondcoat compositions.

Like reference numbers and designations in the various drawings indicate like elements.

DETAILED DESCRIPTION

Figure 1:
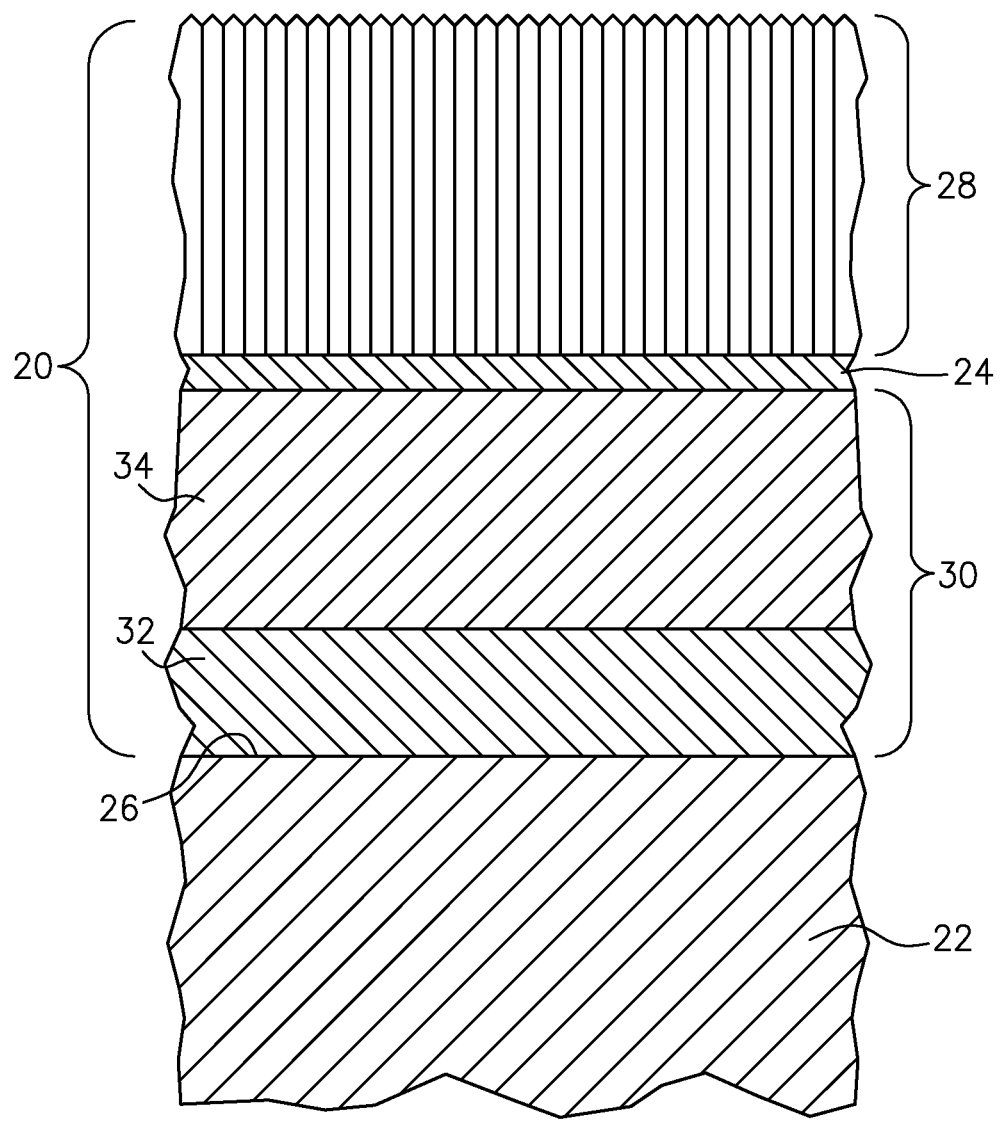
FIG. 1 is a partially schematic sectional view of substrate having a thermal barrier coating (TBC).

FIG. 1 shows a thermal barrier coating system 20 atop a metallic substrate 22. In an exemplary embodiment, the substrate is a nickel-based superalloy or a cobalt-based superalloy such as a cast component (e.g., a single crystal casting) of a gas turbine engine. Exemplary components are hot section components such as combustor panels, turbine blades, turbine vanes, and air seals.

Exemplary substrate compositional ranges are shown in Table I of FIG. 6. In some embodiments of the materials in Table I (and Tables II and III below), the materials may consist essentially of the listed elements (e.g., with at most trace amounts of other elements). In some embodiments, other elements may be present in individual quantities less than 2.0 weight percent and/or aggregate quantities less than 5.0 weight percent, more narrowly 1.0 weight percent individually and 2.0 weight percent aggregate.

The coating system 20 may include a bondcoat 30 atop a surface 26 of the substrate 22 and a thermal barrier coating (TBC) system 28 atop the bondcoat. A thermally grown oxide (TGO) layer 24 will form at the interface of the bondcoat to the TBC. The bondcoat is a multi-layer bondcoat with at least two layers. A first layer 32 is a lower layer. A second layer 34 is over the first layer. In the exemplary system, the bondcoat consists of or consists essentially of the first and second layers (e.g., subject to relatively small gradation/transition with each other (and with the TGO as noted above).

The exemplary TBC is a single-layer TBC. Alternatives may involve a multi-layer TBC with at least two layers or a gradient TBC. In the exemplary system, the TBC consists of or consists essentially of the single layer. Multi-layer systems may be subject to relatively small gradation/transition or continuous transition with each other. Again, there may be a small transition involving the TGO.

Figure 2:
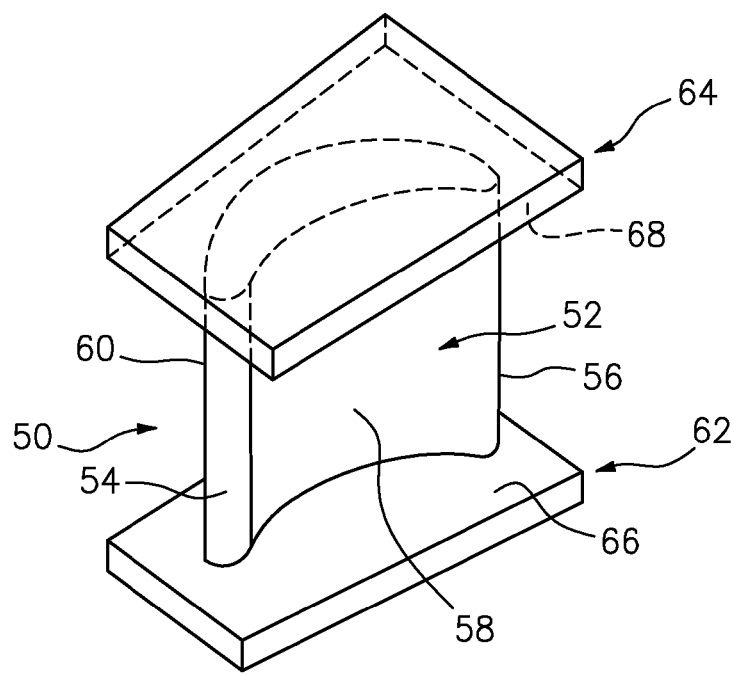
FIG. 2 is a partially schematic view of a vane bearing the TBC.

FIG. 2 shows a vane 50 comprising the cast metallic substrate 22. The vane includes an airfoil 52 having a surface comprising a leading edge 54, a trailing edge 56, a pressure side 58, and a suction side 60. The airfoil extends from an inboard end at a platform or band segment 62 to an outboard end and an outboard shroud or band segment 64. The segments 62 and 64 have respective gaspath surfaces 66 and 68. These are essentially normal to the airfoil surfaces. The TBC system extends at least along the surface of the airfoil and the surfaces 66 and 68.

Figure 3:
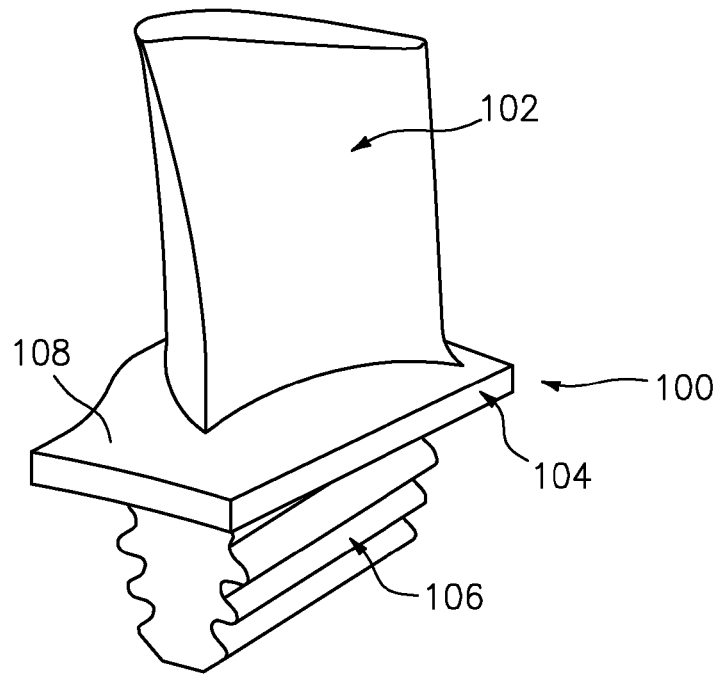
FIG. 3 is a partially schematic view of a blade bearing the TBC.

FIG. 3 shows a blade 100 having an airfoil 102 extending outward from a platform 104. The blade includes an attachment root 106 inboard of the platform. The platform 104 has an outboard gaspath surface 108.

The exemplary bondcoat 30 is an overlay MCrAlY bondcoat. An exemplary MCrAlY overlay bondcoat is a NiCoCrAlYHfSi. Exemplary bondcoat thicknesses are 1-20 mils (0.02 to 0.5 mm), more narrowly, 2-15 mils (0.05 to 0.4 mm) or 3-8 mils (0.08 to 0.2 mm) on average, depending upon the application. The layers 32 and 34 may differ in composition from each other and from more typical bondcoats in several manners. Exemplary layer 34 is a high chrome NiCoCrAlYHfSi, referred to as HiCrBC. This has a high Cr content (e.g., >20 wt %, more particularly, 20-40 wt % or 25-35 wt % or 29.5-34.5 wt % as applied). This bondcoat material provides excellent corrosion resistance at temperature below 1800° F. It was not developed for use as a traditional bondcoat. Its current application is targeted areas that show corrosion issues. HiCrBC has been tested at elevated temperatures and shows a debit in life vs. a typical NiCoCrAlY due to the lower aluminum content.

Exemplary layer 32 is high-aluminum, having composition chosen to complement layer 34. For example, the oxidation and spallation lives of the ceramic TBC may be, in some embodiments, enabled through the formation of an alumina (Al$_2$O$_3$)-based thermally grown oxide (TGO) or alumina scale 24 (discussed below). Exemplary compositional ranges are shown in Table II of FIG. 7. The aluminum from the layer 32 is believed to diffuse through the layer 34.

The alumina scale forms by high-temperature oxidation of the aluminum in the metallic coating, in particular usually during deposition (e.g., electron-beam physical vapor deposition) of the ceramic layer of the thermal barrier coating system. The aluminum diffuses outward from the bondcoat, while the oxygen moves inward from the surrounding atmosphere. The aluminum and the oxygen combine to form an oxide scale, which initially builds up rapidly, with the thickness growing linearly with time. As the alumina scale grows in thickness, the aluminum has to diffuse through the scale to pick up the oxygen, and the thickness buildup slows down (curves downward). At that point in time (perhaps two to three minutes into the ceramic deposition process at about 2000° F. (1093° C.)), the rate of thickness growth is no longer linear with time, but closer to parabolic. At the completion of the ceramic deposition process, perhaps at about 15 to 20 minutes or so, an exemplary scale thickness may be in the range between 0.2 micrometers to 0.4 micrometers (8 microinches to 16 microinches). The oxygen remains available to build the oxide scale during ceramic deposition because it is present in the atmosphere of the coating chamber, but it also easily permeates through the ceramic topcoat being deposited while the oxide scale is forming/growing. The oxygen permeates between the columns of an electron-beam physically vapor deposited ceramic, as well as through the columns, because the zirconium oxide-based ceramic materials are, effectively, transparent (permeable) to the oxygen. The composition of the oxide scale is aluminum oxide, in the form of its alpha-phase, which will form at the temperature of interest of about 2000° F. (1093° C.), but will transform rapidly through some of its metastable forms (such as the theta aluminum oxide) as the part temperature rises during the pre-heat step of the coating process.

The presence, in the bondcoat, of active elements such as yttrium, hafnium, silicon, and zirconium may, in various embodiments further improve the adherence of the thermally grown oxide to the ceramic top coat and bondcoat.

Whereas the HiCrBC composition contains a moderate amount of aluminum, it is lower than in the high-Al (e.g., by at least 2 weight percent or by at least 3 weight percent or, more narrowly, by at least 5 weight percent). This limits effectiveness of the HiCrBC used alone in an oxidizing atmosphere.

Additionally the high chromium content in the HiCrBC will favor the formation of chromia (Cr$_2$O$_3$) at intermediate temperatures. While effective against corrosion products, chromia is less effective than alumina for top coat adherence. Exemplary as-applied Cr content in the HiCrBC will typically be at least 10 weight percent higher than in the high-Al, more narrowly at least 15 weight percent or at least 20 weight percent.

Exemplary thicknesses of each of the layers 32 and 34 is broadly 1 to 10 mils (0.02 to 0.25 mm); narrowly 1.5 to 4 mils (0.04 to 0.1 mm). Deposition techniques include air plasma spray (APS), low pressure plasma spray (LPPS), high velocity oxy fuel (HVOF), sputtering, cathodic arc deposition and EB-PVD. Relative thicknesses may be about equal to each other (e.g., with both layers representing about 20-80% total thickness (locally or average), more particularly 40-60%). The relative importance of the respective properties of these two layers in a given application may influence which layer is thicker.

An exemplary total thickness (local or average) of the one or more TBC layers 28 is in excess of 1 mil (0.02 mm), more particularly at least 3 mils (0.08 mm) or an exemplary 5 to 20 mils (0.13 to 0.50 mm) or 10 to 40 mils (0.25 to 1 mm) depending upon the application.

Such layer(s) may be applied by techniques including APS, EB-PVD, SPS, SPPS, and slurry coating (with EB-PVD being particularly facilitative of the TGO formation).

The hot corrosion protective feature of the bondcoat should be most effective with the columnar form of the thermal barrier coating topcoat deposited by electron beam physical vapor deposition, because the contaminants/corrodants will infiltrate the ceramic TBC between its columns and potentially reach the TBC/bondcoat interface during engine operation. A similar columnar feature develops also with the TBC deposited by the solution plasma spray process of interest for combustor panel and blade outer air seal applications. Moreover, air-plasma spray applied dense vertically cracked TBCs would also have a similar feature, these being of interest to the blade outer air seal, industrial gas turbine blades and vanes applications. The standard TBC chemical compositions are 7 to 8 wt. % yttria-stabilized zirconia, as well as an exemplary 55 to 64 (nominal 59) wt. % gadolinia-stabilized zirconia topcoat with nearly 50% reduced thermal conductivity relative to the yttria-stabilized zirconia.

Figure 4:
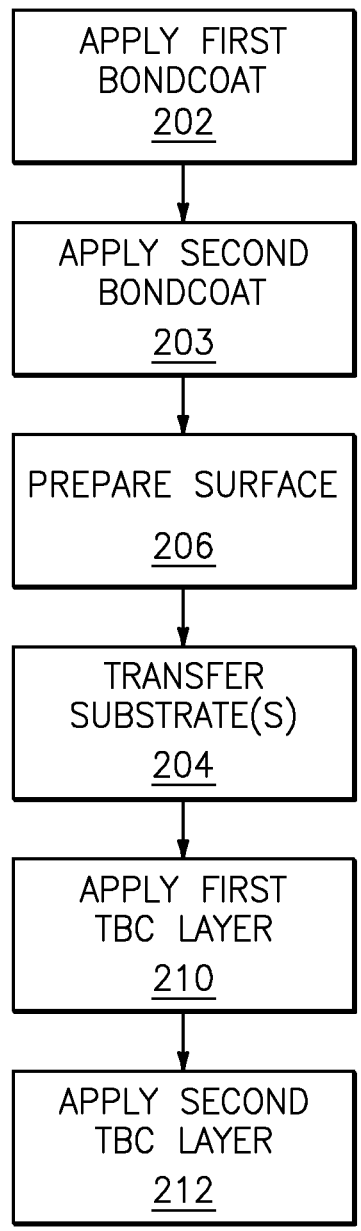
FIG. 4 is a flowchart of a process for coating the substrate of FIG. 1.

FIG. 4 shows an exemplary process 200 for coating the substrate. After initial substrate manufacture (e.g., casting, finish machining, cleaning, and the like) the bondcoat first layer 32 is applied 202 and the second layer 34 then applied 203. This may be done by cathodic arc deposition (or other methods as described above). Both stages may be performed in a single chamber (not shown; or in two chambers with transfer in between) whereafter the substrate(s) are transferred 204 to a second chamber (not shown) for TBC deposition.

A surface preparation 206 may comprise heat treatment, surface finishing/compaction, further cleaning and/or grit blasting (e.g., in yet other chambers) prior to reaching the second chamber. There may also be thermal conditioning via heater (not shown). The TBC 28 or a first layer thereof may be applied 210 via EB-PVD in the second chamber. A further surface preparation (not shown) may follow and may require removal from the second chamber.

After application of the first layer, a second or further TBC layer may be then applied 212 (e.g., by the same method in the same chamber but using at least a partially differing source (e.g., adding deposition from an ingot of an additive to deposition from an ingot of the base material (e.g., 7YSZ) or switching form an ingot of the 7YSZ to an ingot of the combined material)).

Additional layers may be deposited (whether in the aforementioned chambers or otherwise).

Figure 5:
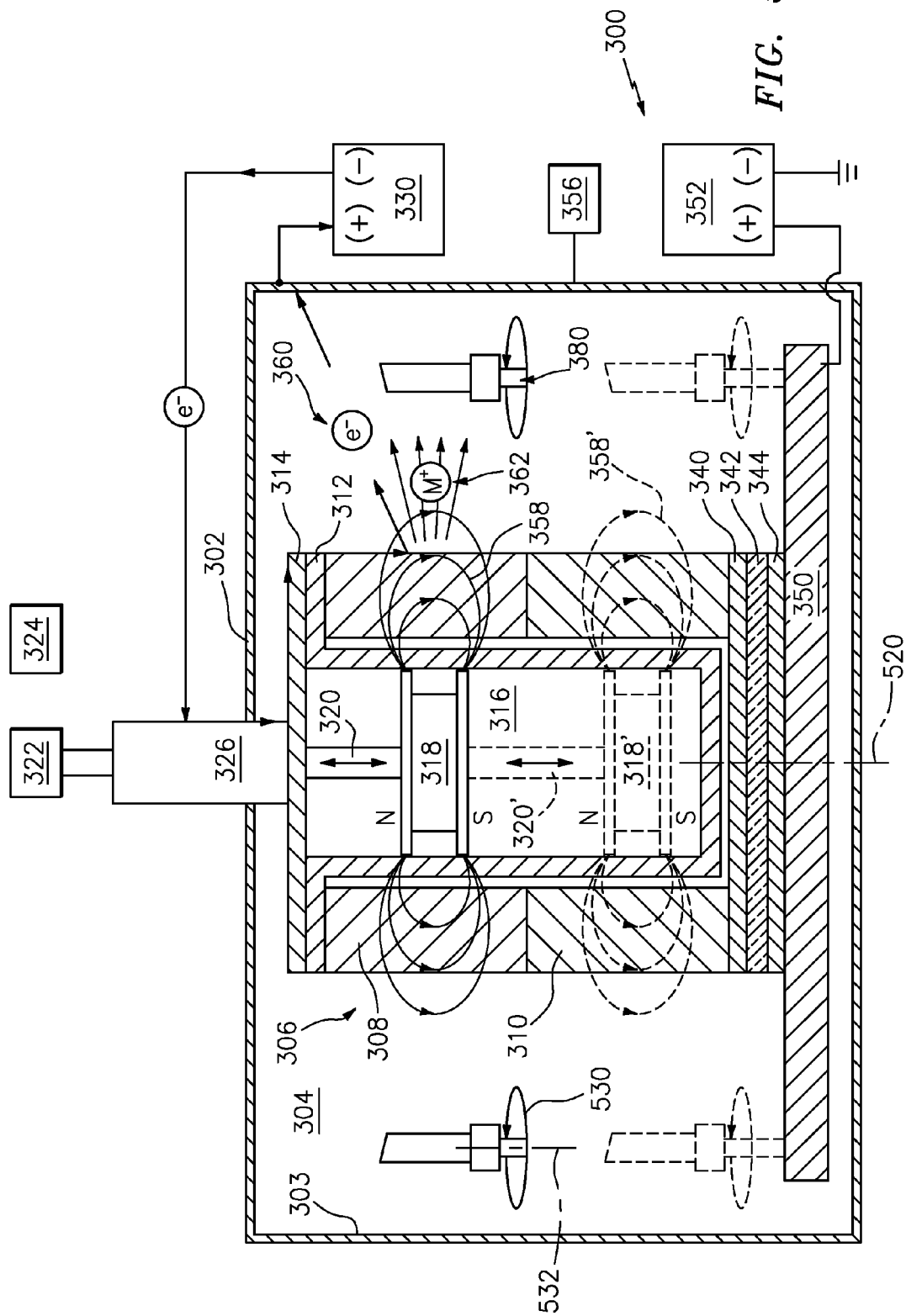
FIG. 5 is a partially schematic view of a deposition apparatus.

FIG. 5 shows an exemplary cathodic arc deposition system 300 for depositing the two bondcoat layers 32 and 34. The system 300 includes a chamber wall structure 302 having an interior surface 303 bounding a chamber interior space 304.

A hollow cathode assembly 306 is centrally located in the chamber interior 304 and comprises at least two cathodes 308, 310. The exemplary cathodes 308 and 310 are axially aligned end-to-end or spaced apart circumscribing a central vertical axis 520. When used to deposit the present bondcoat, one of the two cathodes has composition selected to yield one of the layers while the other cathode has composition selected to yield the other layer. A cup structure 312 having a cover or lid 314 defines a vessel having an interior 316. The exemplary interior contains chilled water (cooling system not shown) for cooling a magnet 318. The exemplary magnet is a permanent magnet having vertically oriented polarity (e.g., with a north-up orientation in this particular example). The water may also cool the cathodes which also cool by radiation. The exemplary lid 314 may be conductive to serve as a pathway for electrical transfer to the cathode(s). In this particular example, at least a rim flange of the cup 312 is also conductive and intervenes between the lid 314 and the upper cathode 308 to establish electrical connection therebetween.

The magnet 318 is carried via a shaft 320 or similar means for reciprocal movement at least between an upper condition/position (solid lines) and a lower condition/position (broken lines). In the upper conditional position, the magnet facilitates deposition from the upper cathode 308. In the lower position, the magnet facilitates deposition from the lower cathode 310. An actuator 322 (e.g., electric, pneumatic, or hydraulic) may drive the reciprocal movement under the control of a control system 324 (e.g., a microcontroller, computer, or the like). In the exemplary implementation, the shaft 320 passes freely through a cylindrical electrode 326 and is insulated relative to the electrode.

A cathode power supply 330 creates a potential difference between the electrode 326 (and thus the cathodes) and the chamber wall 302.

FIG. 5 further shows a conductive support plate 340 in contact with a lower rim of the lower cathode 310 to complete the electrical circuit thereacross. 340 is made from a highly conductive metal such as copper to help pull heat out of 310 (the lower cathode) and the 312 (cup structure). 342 is a non-conductive material such as a ceramic that supports 340 (plate) and separates it from 344 (metallic plate) and 350 (platter). The plate 340 is, in turn, supported by an insulator 342 (e.g., a ceramic plate) which, in turn, may be supported by an additional plate 344. One, could manufacture a separation distance (where 344 resides) into the platter 350; however 344 can have its thickness easily modified by exchanging separation plates instead of building a new platter 350.

FIG. 5 further shows a part holder or platter 350. The part holder is connected to a power supply 352 for applying a bias voltage relative to ground. An actuator (370) may allow the part holder to be lifted or lift the parts between respective positions for deposition from the two cathodes. Additionally, rotary or other actuators may be provided to rotate the parts about axes (e.g., rotation in directions 530 about axes 532 for evenness of deposition).

In the exemplary embodiment, for purposes of illustration, the upper cathode will be assumed to be associated with the bondcoat material 32 and the lower cathode with the bondcoat material 34. These cathodes may be formed of the respective materials or may have slightly altered combinations to account for species attrition during deposition. Accordingly, the magnet and parts are initially in the solid line raised positions associated with the upper cathode 308.

With the power supplies 330 and 352 powered, a cathodic arc 360 is formed. FIG. 5 shows the magnetic field lines as 358. The cathodic arc extends between the associated negatively-charged cathode 308 and the positively-charged chamber wall 302 serving as an anode. With the part(s) maintained at negative potential by the power supply or voltage source 352, a stream 362 of positively-charged atoms deposit on the part to form the associated layer 32 or 34. The residence time of the part and magnet in the first position will determine the thickness of the first layer 32. The appropriate thickness may be determined by experimental verification of deposition parameters.

The position of the magnet 318 will determine the location of the cathodic arc. To shift from deposition of material from the cathode 308 to the cathode 310, the magnet is downwardly shifted by the actuator 322 to the broken-line position. In the exemplary embodiment, the parts are also shifted downwardly to remain at generally even level with the magnet.

One or more embodiments have been described. Nevertheless, it will be understood that various modifications may be made. For example, implemented in the remanufacture of a given article for the reengineering of the configuration of such article, details of the baseline and its use may influence details of any particular implementation. Accordingly, other embodiments are within the scope of the following claims.

What is claimed is:

1. A method for manufacturing a coated article, the coated article comprising:
   a metallic substrate (22);
   a bondcoat (30) comprising:
      a first layer (32); and
      a second layer (34), wherein:
         the bondcoat second layer has a chromium content at least 10 weight percent higher than a chromium content of the bondcoat first layer; and
         the bondcoat first layer has an aluminum content at least 2 weight percent higher than an aluminum content of the bondcoat second layer; and
   a thermal barrier coating (TBC) (28),
the method comprising:
   applying (202) the bondcoat first layer having an as-applied weight % composition comprising 5-30 Cr, up to 30 Co, 6-35 Al, 0.1-2 Y, 0.1 to 2 Hf, and 0.1 to 7 Si, up to 8 Ta, up to 8 W, up to 2 Mo, and up to 2 Zr; and
   applying (203) the bondcoat second layer atop the bondcoat first layer and having an as-applied weight % composition comprising 20-40 Cr, up to 30 Co, 5-13 Al, up to 2 Y, up to 2 Si, and up to 2 Hf.

2. The method of claim 1 wherein:
   the TBC comprises material selected from the group consisting of yttria-stabilized zirconia or gadolinia-stabilized zirconia or combinations thereof.

3. The method of claim 1 wherein the article consists essentially of the substrate, the bondcoat first layer, the bondcoat second layer, and the TBC.

4. The method of claim 1 wherein:
   the substrate comprises a nickel-based or a cobalt-based superalloy.

5. The method of claim 4 wherein:
   if the substrate is the nickel-based superalloy it comprises in weight % 4.5-24 Cr, 4.5-20 Co, up to 4.5 Mo, 1.5-11 W, up to 5.5 Ti, up to 12.25 Ta, 1-6.2 Al, up to 0.05 B, up to 0.2 C, up to 0.2 Zr, up to 1.2 Nb, up to 2.0 Hf, up to 3.5 Re; and
   if the substrate is the cobalt based superalloy it comprises, in weight %, 18-31 Cr, up to 15 Ni, up to 10 Mo, up to 12 W, up to 3 Ti, 1-10 Ta, up to 0.5 Al, up to 0.02 B, 0.1 to 0.9 C, 0.2 to 0.6 Zr, up to 2 Nb, and up to 2 Fe.

6. The method of claim 1 wherein:
   the applying of the bondcoat first layer and the applying of the bondcoat second layer are accomplished by cathodic arc deposition.

7. The method of claim 1 wherein:
   the bondcoat second layer is applied directly atop the bondcoat first layer; and the TBC is applied directly atop the bondcoat second layer.

8. The method of claim 1 wherein:
a characteristic thickness of the bondcoat first layer is 1-10 mils (0.02 mm to 0.25 mm); and
a characteristic thickness of the bondcoat second layer is 1-10 mils (0.02 mm to 0.25 mm).

9. The method of claim 1, wherein:
the TBC comprises yttria-stabilized zirconia or gadolinia-stabilized zirconia or combinations thereof.

10. The method of claim 1, wherein:
the substrate comprises a nickel-based superalloy or a cobalt-based superalloy.

11. A method for cathodic arc deposition from a first cathode (308) and a second cathode (310), the method comprising:
placing one or more substrates in a chamber (304);
generating an arc (360) between the first cathode (308) and an anode (302) to deposit a first material from the first cathode;
generating an arc between the second cathode and the anode to deposit a second material from the second cathode;
shifting a relative position of a magnet (318) and the first and second cathodes to shift from depositing the first material to depositing the second material; and
vertically moving substrates from a first position associated with deposition from the first cathode to a second position associated with deposition from the second cathode.

12. The method of claim 11 wherein:
the shifting comprises vertically moving the magnet from a first position to a second position.

13. The method of claim 11 wherein:
the anode is a wall of the chamber.

14. The method of claim 11 wherein:
the substrate comprises a nickel-based or cobalt-based superalloy;
the first material is a first MCrAlY; and
the second material is a second MCrAlY different from the first MCrAlY.

15. The method of claim 11 wherein:
the anode is a wall (302) of the chamber (304); and
the first cathode and second cathode surround a vertical axis (520) one above the other.

16. The method of claim 15 wherein:
the first cathode comprises a first MCrAlY; and
the second cathode comprises a second MCrAlY different from the first MCrAlY.

* * * * *